United States Patent
Xu et al.

(10) Patent No.: US 8,470,646 B2
(45) Date of Patent: Jun. 25, 2013

(54) MODULATION OF RESISTIVITY IN CARBON-BASED READ-WRITEABLE MATERIALS

(75) Inventors: Huiwen Xu, Sunnyvale, CA (US); Xiying Chen, San Jose, CA (US); Er-Xuan Ping, Fremont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 273 days.

(21) Appl. No.: 12/650,417

(22) Filed: Dec. 30, 2009

(65) Prior Publication Data
US 2010/0163824 A1  Jul. 1, 2010

Related U.S. Application Data

(60) Provisional application No. 61/142,192, filed on Dec. 31, 2008.

(51) Int. Cl.
*H01L 21/332* (2006.01)
*H01L 21/20* (2006.01)
*H01L 29/02* (2006.01)
*H01L 47/00* (2006.01)

(52) U.S. Cl.
USPC ........... 438/139; 438/381; 438/382; 438/133; 257/2; 257/3

(58) Field of Classification Search
USPC ................. 257/2–5; 438/133, 139, 381–382
See application file for complete search history.

(56) References Cited

U.S. PATENT DOCUMENTS

| | | | |
|---|---|---|---|
| 4,960,751 A | 10/1990 | Yamazaki | |
| 5,073,785 A | 12/1991 | Jansen et al. | |
| 5,915,167 A | 6/1999 | Leedy | |
| 6,323,119 B1 | 11/2001 | Xi et al. | |
| 6,397,034 B1 | 5/2002 | Tarnawskyj et al. | |
| 6,952,030 B2 | 10/2005 | Herner et al. | |
| 7,176,064 B2 | 2/2007 | Herner | |
| 7,575,984 B2 | 8/2009 | Radigan et al. | |
| 7,619,247 B2 | 11/2009 | Moore et al. | |
| 7,812,335 B2 | 10/2010 | Scheuerlein | |
| 2004/0251551 A1 | 12/2004 | Hideki | |
| 2006/0022347 A1 | 2/2006 | Campbell | |
| 2006/0043882 A1* | 3/2006 | Shi et al. | 313/504 |

(Continued)

FOREIGN PATENT DOCUMENTS

| | | |
|---|---|---|
| EP | 1892722 | 2/2008 |
| EP | 1916722 | 4/2008 |
| WO | WO 2009088889 | 7/2009 |
| WO | WO 2009088890 | 7/2009 |

OTHER PUBLICATIONS

Zhanling et al (The effect of surface sp2/sp3 bonding ratios of carbon films on the field emission property, This paper appears in: Vacuum Electron Sources Conference, 2004.).*

(Continued)

*Primary Examiner* — Matthew Landau
*Assistant Examiner* — Khaja Ahmad
(74) *Attorney, Agent, or Firm* — Dugan & Dugan, PC

(57) ABSTRACT

In a first aspect, a method of forming a memory cell is provided that includes (1) forming a metal-insulator-metal ("MIM") stack above a substrate, the MIM stack including a carbon-based switching material having a resistivity of at least $1 \times 10^4$ ohm-cm; and (2) forming a steering element coupled to the MIM stack. Numerous other aspects are provided.

17 Claims, 3 Drawing Sheets

U.S. PATENT DOCUMENTS

| | | | |
|---|---|---|---|
| 2006/0250836 A1 | 11/2006 | Herner et al. | |
| 2007/0190722 A1 | 8/2007 | Herner | |
| 2007/0243721 A1 | 10/2007 | Autryve et al. | |
| 2008/0070162 A1* | 3/2008 | Ufert | 430/290 |
| 2008/0239790 A1 | 10/2008 | Herner | |
| 2009/0168491 A1 | 7/2009 | Schricker et al. | |
| 2009/0257270 A1 | 10/2009 | Schricker et al. | |
| 2010/0006811 A1 | 1/2010 | Xu et al. | |
| 2010/0006812 A1 | 1/2010 | Xu et al. | |
| 2010/0012914 A1 | 1/2010 | Xu et al. | |
| 2011/0057717 A1 | 3/2011 | Manning et al. | |

OTHER PUBLICATIONS

Invitation to Pay Additional fees for PCT/US2009/069875 mailed Mar. 29, 2010.

Kreupl, et al. "Carbon-Based Resistive Memory", IEDM Technical Digest, IEDM 2008, pp. 1-4.

International Search Report and Written Opinion of International Application No. PCT/US2009/069875 mailed Jun. 15, 2010.

Mani et al. Nanocrystalline Graphite for Electrochemical Sensing. Journal of Electrochemical Society, 154 (4) 2005, E154-E159.

Smith et al., Nitrogen-doped Plasma Enhanced Chemical Vapor Deposited (PECND) Amorphous Carbon: Processes and Properties. Thin Solid Films 398-399, 2001, pp. 163-169.

Chambers. The Synthesis and Characterizations of Model Interface Couples for Inorganic Matrix Composite Applications. Dissertation for PhD, MIT, 1994, pp. 28-33 and 72-78.

Podder et al., Boron Doped Amorphous Carbon Thin Films Grown by r.f. PECVD Under Different Partial Pressure. Diamond & Related Materials 14 (2005), pp. 1799-1804.

Teo et al., "The Significance of Plasma Heating in Carbon Nanotube and Nanofiber Growth", Nano Letters, 2004, vol. 4, No. 5, pp. 921-926.

Cho et al., "Fabrication and Characteristics of Amorphous Carbon Films Grown in Pre Methane Plasma by Using Radio Frequency Plasma Enhanced Chemical Vapor Deposition", Jpn, J. Appl. Phys. vol. 42, 2003, pp. 1744-1748.

* cited by examiner

MODULATION OF RESISTIVITY IN CARBON-BASED READ-WRITEABLE MATERIALS

The present application claims priority from U.S. Provisional Patent Application Ser. No. 61/142,192, filed Dec. 31, 2008, and titled "Modulation of Resistivity in Carbon-Based Read-Writeable Materials," which is hereby incorporated by reference herein in its entirety for all purposes.

CROSS REFERENCE TO RELATED APPLICATIONS

The present application is related to the following applications, each of which is hereby incorporated by reference herein in its entirety for all purposes:

U.S. patent application Ser. No. 12/465,315, filed May 13, 2009 and titled "Carbon-Based Interface Layer for a Memory Device and Methods of Forming the Same;" and U.S. patent application Ser. No. 12/499,467, filed Jul. 8, 2009 and titled "Carbon-Based Resistivity-Switching Materials and Methods of Forming the Same."

FIELD OF THE INVENTION

The present invention relates to non-volatile memories and more particularly to modulating the resistivity of carbon read-writable materials.

BACKGROUND OF THE INVENTION

Non-volatile memories formed from reversible resistance-switching elements are known. For example, U.S. patent application Ser. No. 11/125,939, to Herner et al., filed May 9, 2005, published Nov. 9, 2006, as US 2006/0250836A1, and titled "Rewriteable Memory Cell Comprising A Diode And A Resistance-Switching Material," which is hereby incorporated by reference herein in its entirety for all purposes, describes a three-dimensional, rewritable non-volatile memory cell that includes a diode coupled in series with a reversible resistivity-switching material such as a metal oxide or metal nitride.

It is also known that certain carbon-based films may exhibit reversible resistivity-switching properties, making such films candidates for integration within a three-dimensional memory array. For example, U.S. patent application Ser. No. 11/968,154, filed Dec. 31, 2007, titled "Memory Cell That Employs A Selectively Fabricated Carbon Nano-Tube Reversible Resistance-Switching Element And Methods Of Forming The Same" (hereinafter "the '154 Application"), which is hereby incorporated by reference herein in its entirety for all purposes, describes a rewriteable non-volatile memory cell that includes a diode coupled in series with a carbon-based reversible resistivity-switchable material. However, integrating carbon-based resistivity-switching materials in memory devices is difficult.

SUMMARY OF THE INVENTION

In a first aspect of the invention, a method of forming a memory cell is provided that includes (1) forming a metal-insulator-metal ("MIM") stack above a substrate, the MIM stack including a carbon-based switching material having a resistivity of at least $1\times10^4$ ohm-cm; and (2) forming a steering element coupled to the MIM stack.

In a second aspect of the invention, a method of forming a memory cell is provided that includes (1) forming a first conducting layer above a substrate; (2) forming a steering element above the first conducting layer; (3) forming a carbon-based switching material above the first conducting layer, the carbon-based switching material having a resistivity of at least $1\times10^4$ ohm-cm; and (4) forming a second conducting layer above the carbon-based read-writeable material and the steering element.

In a third aspect of the invention, a memory cell is provided that includes (1) a MIM stack, the MIM stack including a carbon-based switching material having a resistivity of at least $1\times10^4$ ohm-cm; and (2) a steering element coupled to the MIM stack.

In a fourth aspect of the invention, a memory cell is provided that includes (1) a first conducting layer; (2) a steering element above the first conducting layer; (3) a carbon-based switching material above the first conducting layer, the carbon-based switching material having a resistivity of at least $1\times10^4$ ohm-cm; and (4) a second conducting layer above the carbon-based read-writeable material and the steering element.

Other features and aspects of this invention will become more fully apparent from the following detailed description, the appended claims and the accompanying drawings.

BRIEF DESCRIPTION OF THE DRAWINGS

By reference to the appended drawings, which illustrate embodiments of the invention, the detailed description provided below explains in detail various features, advantages and improvements of the present invention. It is to be noted, however, that the appended drawings are not intended to be to scale and illustrate only typical embodiments of this invention; they therefore are not to be considered limiting of its scope, for the invention may admit to other equally effective embodiments.

DETAILED DESCRIPTION

Figure 1:
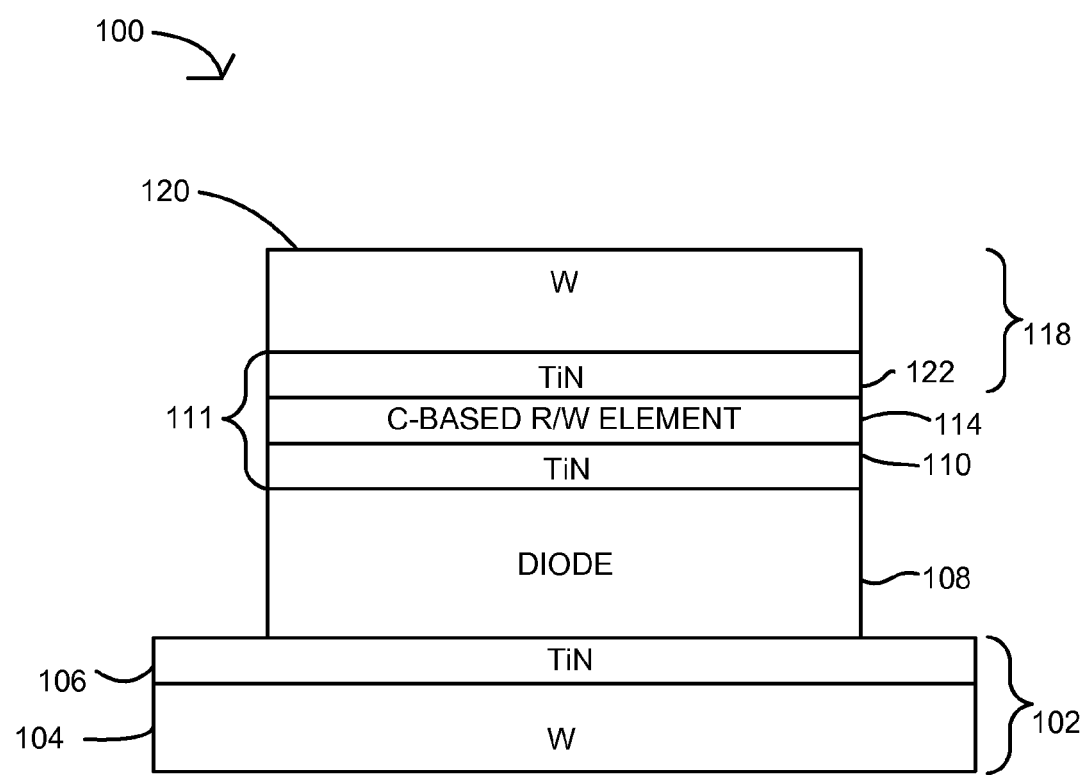
FIG. 1 is a cross-sectional schematic diagram of an exemplary memory cell in accordance with an embodiment of the present invention, the memory cell comprising a MIM structure.

Some carbon-based materials have been shown to exhibit reversible resistivity-switching properties that may be suitable for use in non-volatile memories. As used herein, carbon-based read-writeable or "switching" materials generally may include one or more of amorphous carbon containing nanocrystalline graphene (referred to herein as "graphitic carbon"), graphene, graphite, carbon nano-tubes, amorphous diamond-like carbon ("DLC"), silicon carbide, boron carbide and other crystalline forms of carbon, and may also include secondary materials. Although previously considered not to switch, DLC has been found to be switchable. DLC tends to appear at formation temperatures lower than 500° C., to be $sp^3$-hybridized, and to be amorphous with respect to long range order. As used herein, the term "switchable amorphous carbon" means graphitic carbon, DLC, and any other type of amorphous carbon that includes crystalline regions that switch.

Some carbon-based switching materials ("C-based switching materials") have demonstrated memory switching properties on lab-scale devices with a 100× separation between on and off states and mid-to-high range resistance changes. Such a separation between on and off states renders these materials viable candidates for memory cells formed using the C-based switching materials in series with vertical diodes, thin film transistors or other steering elements. For example, a MIM stack formed from a C-based switching material sandwiched between two metal or otherwise conducting layers may serve as a resistance change element for a memory cell. In particular, such a MIM stack may be integrated in series with a diode or transistor to create a read-writable memory device as described, for example, in the '154 Application.

However, integrating C-based resistivity-switching materials in memory devices is difficult. For example, some C-based switching materials, such as plasma enhanced chemical vapor deposition ("PECVD") formed carbon films, may have a virgin resistivity that is low relative to the resistivity of the steering element (e.g., a diode) used within a memory cell. The results may include: (1) a high initial current for the memory cell not compatible with the steering element; and (2) a need for a high voltage and current to reset the C-based switching material upon initial use.

The present invention addresses problems associated with resistivity profiles of C-based resistivity-switching materials integrated in non-volatile memories. The present invention is directed at modulating (increasing) resistivities of C-based materials through adjustment of process window parameters. For example, some embodiments of the present invention involve modulating the resistivity of a C-based switching material by decreasing a crystallinity percentage and increasing an $sp^3$:$sp^2$ bond ratio of the C-based switching material. This may be achieved, for example, by reducing process temperature and/or reducing ion energy and plasma bombardment. Reduced plasma bombardment may be accomplished by increasing pressure, decreasing power, and reducing ionic species concentration (e.g., Ar, He, etc.)

In some embodiments, a resistivity of the C-based switching material in an on-state is at least $1\times10^3$ ohm-m ($1\times10^5$ ohm-cm), whereas a resistivity of the C-based switching material in an off-state is at least $1\times10^4$ ohm-m ($1\times10^6$ ohm-cm). Other resistivity values may be used.

A first approach, increasing resistivity in a C-based switching material involves adjusting process parameters to decrease a crystallinity percentage and to increase an $sp^3$:$sp^2$ bond ratio of the C-based switching material. Trigonally bonded carbon ($sp^2$-bonded), also referred to as graphite-like carbon ("GLC"), is more conductive than tetrahedrally bonded carbon ($sp^3$-bonded), also referred to as DLC.

A second approach for increasing resistivity in a C-based switching material involves adjusting process parameters to control the orientations of crystallites within the C-based switching material. Resistivity for current paths in line with crystallite orientation is less than resistivity for current paths perpendicular to the crystallite orientation, so causing crystallite orientations of a switching layer to be out of line with (e.g., perpendicular to) the current path of a memory cell increases the effective resistivity of a switching layer of the memory cell.

In accordance with embodiments of the present invention, modulating resistivities of C-based switching materials may improve compatibilities with nearby materials of a memory cell by better matching electrical performance profiles of the materials. Modulating the resistivity of a C-based switching material may improve compatibility with steering elements such as diodes. For example, a memory element (e.g., a MIM stack) that employs a C-based switching material preferably has a comparable resistance to that of its steering element at each of an on-state and an off-state.

Promoting the concentration of $sp^3$ carbon-carbon bonds also may increase the amorphous nature, referred to as amorphization, of the C-based switching material. Amorphizing the carbon may increase material density, and greater density may improve device performance by reducing set and/or reset times.

When a C-based switching material element of a memory cell does not have on/off state resistances comparable to those of the steering element (e.g., diode) of the memory cell, two issues may arise: (1) voltage drop across the steering element may be too high, possibly damaging the steering element, whereas voltage drop across the C-based switching material may not be enough to switch the material; and (2) an operation current of the memory cell may be too high, which also may damage the steering element. Furthermore, some C-based switching materials, such as PECVD deposited carbon films, may be in a "set" state (e.g., a low-resistance, on-state) following deposition, thereby requiring a reset operation at the beginning of use after manufacture. Modulation of C-based switching material resistivity as described herein may overcome or reduce the significance of such issues. A reduction in set and/or reset times also may result from the modulation of the resistivity in a C-based switching material (as described below).

Temperature Effects for PECVD C-Based Switching Materials

Polycrystalline graphitic carbon material may be produced at temperatures as high as 550° C. On the other hand, completely amorphous DLC material may be produced at temperatures as low as 350° C.-400° C. Polycrystalline graphitic carbon may contain approximately 100% $sp^2$ bonds, while amorphous DLC may include up to about 50% $sp^3$ bond content. As mentioned above, both DLC and graphitic carbon materials have been found to be switchable, but DLC and graphitic carbon show different switching characteristics. For instance, DLC-type material may have a high virgin resistivity and a low reset current. Moreover, set and reset voltages of polycrystalline graphitic materials tend to be sensitive to the carbon film thickness. Graphitic material may have a low virgin resistivity and a high set/reset current. Inasmuch as other carbon switching materials made at a temperature in between 300° C. and 550° C. also may exhibit switching, switching may be achieved in carbon made in the broad PECVD process window of, for example, 300° C.-550° C., across the spectrum of amorphous DLC material and polycrystalline material. Other processing parameters may be used.

Although a large range of PECVD C-based materials may be switched, in accordance with the present invention, the resultant C-based switching resistivity preferably remains larger than about $1\times10^4$ ohm-cm in order to be compatible with a steering element such as a diode. Various combinations of decreasing the deposition temperature, decreasing dilution gas to precursor ($C_xH_y$) ratio, increasing RF power, and increasing pressure may be used to increase resistivity to within suitable ranges. For instance, processes with temperatures of about 150° C. to 450° C. may produce carbon films with resistivity levels compatible with a steering element (e.g., a vertical polysilicon or other diode).

Three basic aspects of film structure are of particular interest: (a) percentage crystallinity (crystalline versus amorphous); (b) $sp^3$:$sp^2$ bond ratio; and (c) levels of microporosity. Microporosity is considered to relate to the presence of H bonded to C, inasmuch as H may serve as an ending element and may reduce C-to-C crosslinking, thus reducing the local film density, thereby reducing general film density. In accordance with the present invention, percentages of $sp^3$ bonds within a C-based switching material may range from about 0% to 50% (e.g., an $sp^3:sp^2$ ratio of up to about 1:1), and in some embodiments from about 0% to 30% (e.g., an $sp^3:sp^2$ ratio of up to about 0.3:0.7). Percentages of crystallinity preferably may range from about 0% to 1%, while densities may range from about 0.5 to 2.8, preferably from about 0.5 to 2.0. Other $sp^3:sp^2$ bond ratios, crystallinity percentages and/or densities may be used.

Among the process parameters, in some embodiments, temperature may be most influential, with the carrier gas (or dilution gas) to precursor gas ratio being the next most influential, followed by RF power, then pressure, etc. Temperature may have a direct impact on film crystallinity percentage and $sp^3:sp^2$ ratio. Decreasing temperature appears to decrease film crystallinity percentages and increase $sp^3$ content. Crystallinity may start to disappear at temperatures below about 450° C. For instance, a dominant polycrystalline graphitic phase (>90%) appears to occur around 550° C., whereas about 450° C. results in some crystalline content (~10%). A crystalline seed may exist at or above 400° C., whereas process temperatures at about 350° C. appear to result in completely amorphous samples. Higher resistivities produced at lower temperatures appear to be related to changes in the dielectric constant.

Carrier/Precursor Gas Ratio Effects for PECVD C-Based Switching Materials

In some embodiments, for carrier-to-precursor gas ratios less than about fifteen, increasing the carrier gas appears to increase plasma density and sputtering. For carrier-to-precursor gas ratios of about fifteen and higher, increasing the carrier gas appears to dilute plasma effectiveness and reduce deposition rates. Increasing the carrier-to-precursor gas ratio appears to mainly increase film density and crystallinity ($sp^2$: $sp^3$ ratio), and reduce deposition rate. Decreasing the carrier-to-precursor gas ratio appears to increase the resistivity.

Experimental data tend to indicate that changes in carrier-to-precursor gas ratios affect a C-based switching layer in various ways. For instance, in some embodiments, a relative static permittivity value, e.g., dielectric constant (k), may change little when the carrier-to-precursor gas ratio is less than or equal to about five, but may vary dramatically when the carrier-to-precursor gas ratio is greater than about five. When processes have different process temperatures but result in films having similar stresses and comparable densities, the dielectric constant k appears to decrease with temperature, suggesting that k is more sensitive to the $sp^2:sp^3$ ratio than to film density. Although temperature appears dominant in affecting stress, stress, which is indicative of film density, appears to be able to be tuned by parameters in addition to temperature. Similar stress, e.g., compressive stress, appears to be obtainable across a wide temperature range, suggesting that parameters other than temperature may be used to obtain a compact, dense film.

RF Power Effects for PECVD C-Based Switching Materials

The dielectric constant k also appears to decrease with increases in RF power until k stabilizes after reaching a critical RF power level. The critical RF power level appears to increase with reductions in temperature. At a process temperature of 550° C., for example, as RF power increases, such as above 150 Watts, H content appears to increase as well. Graphitic phase appears to increase with RF power increases, but appears to stabilize after the RF power level reaches or exceeds about 150 Watts. The data appear to indicate that crosslinking continues to occur up to the critical RF value, and after the critical RF value, RF sputtering appears to cause additional dangling bonds and increases H content. At a process temperature of about 450° C., for example, dielectric constant k has been observed to stabilize at about 400 Watts.

Dielectric constant k values appear to decrease as RF levels increase to higher levels. The k values appear to be related to increasing $sp^3$ content. Data also appear to indicate that vertical resistivity correlates with the k value, wherein increases in the k value accompany decreases in resistivity. Thus vertical resistivity in turn appears to correlate with $sp^3$ content in the carbon film. Resistivity also appears to decrease with increases in film thickness. Therefore, decreasing the temperature appears to decrease the k value, increase the $sp^3$ content and increase the resistivity. Increasing the RF power level also appears to decrease the k value, increase the $sp^3$ content and increase the resistivity. In addition, RI values continue to increase with RF power increases.

Basal Planes Orientation for C-Based Switching Materials

In some embodiments, crystallite orientation may be engineered to modulate C-based switching material resistivity. For example, to increase the resistance of a MIM stack having a C-based switching material layer, the C-based switching layer may be formed to have graphitic crystallites (and/or ribbons having microstructures) with basal planes out of line with a current path through the MIM stack. The basal planes may be non-parallel or even perpendicular to the current path. The greater the desired resistivity (or resistance of the MIM stack), the more the crystallites of the C-based switching layer may be engineered to cross or be perpendicular to the current path through the MIM stack.

Basal plane orientation engineering may be accomplished, for instance, with PECVD using a capacitive coupled plasma ("CCP") tool. Other embodiments may include physical vapor deposition ("PVD") using sputtering of graphite; thermal chemical vapor deposition ("CVD"), including low pressure CVD and sub-atmospheric CVD, at processing temperatures below 600° C.; as well as atomic layer deposition ("ALD"). In addition, PECVD using inductive coupled plasma ("ICP") may be used to completely decouple plasma density and ionic energy/physical bombardment, having a minimum sheath voltage and electrical field near the deposition surface. As a result, such an ICP-type PECVD process may induce minimum alignment of graphitic crystallite basal planes with the current path through the MIM stack and therefore increase the resistivity of the C-based switching material. Such increased resistivity may be achieved without decreasing temperature.

In some embodiments, changing crystallite orientations may involve starting with a thin (about 25 angstroms, although other thicknesses may be used) completely amorphous carbon film to initially promote growth of basal planes parallel to an interface with the bottom MIM electrode, followed by varying the process to reduce directional ionic plasma. For instance, using inductive coupled plasma without bias may completely decouple plasma density and directionality.

Exemplary Process Parameters for PECVD Formed C-Based Switching Materials

Table 1 below describes an exemplary process window for forming a C-based switching layer within a PECVD chamber using a processing gas comprising one or more hydrocarbon compounds and a carrier/dilutant gas. It should be understood that the carrier gas may comprise any suitable inert or non-reactive gas such as one or more of He, Ar, $H_2$, Kr, Xe, $N_2$, etc. In some embodiments, the hydrocarbon compounds may have the formula $C_xH_y$, with x ranging from about 2 to 4 and y ranging from about 2 to 10.

TABLE 1

EXEMPLARY PECVD PROCESS PARAMETERS AND
RESULTANT C-BASED FILM PROPERTIES

| PROCESS PARAMETER | EXEMPLARY RANGE | PREFERRED RANGE |
|---|---|---|
| Precursor Flow Rate (sccm) | 10-1000 | 20-100 |
| Carrier Flow Rate (sccm) | 10-10000 | 1000-5000 |
| Carrier/Precursor Ratio | 0.5:1-100:1 | 1:1-50:1 |
| Chamber Pressure (Torr) | 1-10 | 2-7 |
| $1^{st}$ RF frequency (MHz) | 10-50 | 13.5-30 |
| $2^{nd}$ RF frequency (KHz) | 90-500 | 90 |
| $1^{st}$ RF power (Watts) | 30-1000 | 30-800 |
| $2^{nd}$ RF power (Watts) | 0-500 | 0-100 |
| $2^{nd}$ RF/$1^{st}$ RF Power Ratio | 0.4:1-0.8:1 | 0.6:1 |
| RF Power Density (W/in$^2$) | 0.1-20 | 0.3-10 |
| Process Temperature (° C.) | 250-600 | 300-550 |
| Electrode Spacing (Mils) | 200-1000 | 200-500 |
| Deposition Rate (Å/sec) | ≦50 | ≦30 |
| Total Film Thickness (Ang) | ≦1000 | ≦500 |

In particular embodiments, C-based switching materials may be formed to exhibit sheet resistance ("Ω/□" or "ohms-square") for a 1000 angstrom film from about $1\times10^4$ Ω/□ to about $1\times10^7$ Ω/□, and more preferably about $1\times10^4$ Ω/□ or greater. Similarly, some embodiments may comprise an amorphous carbon film with nanocrystallites. Other films parameters and characteristics may be pursued as well (e.g., alternate values of deposition rate, film thickness, sheet resistance/resistivity, etc.).

Sheet resistance is a measure involving a current flowing along the plane of the sheet, not perpendicular to it. In MIM stacks having horizontally-oriented C-based switching layers, such as in FIG. 1, the current primarily flows vertically from one electrode to the other, through the C-based switching layer, and thus basically perpendicular to the major surfaces of the C-based switching layer. Therefore, vertical resistance and vertical resistivity are more relevant measures than sheet resistance in such horizontal C-based switching layers. Insofar as layer geometry can affect vertical resistivity on such small scales, reference to a layer's vertical resistivity or vertical resistance typically refers to the average vertical resistivity or average vertical resistance.

Table 2 below describes exemplary process parameters for forming a DLC switching layer and a graphitic carbon switching layer within a PECVD chamber using a processing gas such as $C_3H_6$ and a carrier/dilutant gas such as He. Other parameters may be determined in accordance with other disclosed examples.

TABLE 2

EXEMPLARY PROCESS PARAMETERS
AND FILM PROPERTIES

| PROCESS PARAMETER | DIAMOND-LIKE CARBON | GRAPHITIC CARBON |
|---|---|---|
| Process Temperature (° C.) | 400 | 550 |
| Carrier/Precursor Ratio | 15 | 50 |
| $1^{st}$ RF power (Watts) | 650 | 150 |
| Chamber Pressure (Torr) | 4 | 5 |
| Electrode Spacing (Mils) | 350 | 350 |

Table 3 below describes exemplary and preferred process parameters for forming a C-based switching layer within a PECVD chamber using a processing gas comprising one or more hydrocarbon compounds and a carrier/dilutant gas. It should be understood that the carrier gas may comprise any suitable inert or non-reactive gas such as one or more of He, Ar, $H_2$, Kr, Xe, $N_2$, etc. In some embodiments, the hydrocarbon compounds may have the formula $C_xH_y$, with x ranging from about 2 to 4 and y ranging from about 2 to 10. Other parameters may be determined in accordance with other disclosed examples.

TABLE 3

FURTHER EXEMPLARY PARAMETERS AND FILM PROPERTIES

| PROCESS PARAMETER | EXEMPLARY RANGE | PREFERRED RANGE #1 | PREFERRED RANGE #2 |
|---|---|---|---|
| Process Temperature (° C.) | 100-1000 | 250-550 | 250-450 |
| Carrier/Precursor Ratio | 0.1:1-100:1 | 0.3:1-50:1 | 0.3:1-50:1 |
| RF Power Density (W/in$^2$) | 0.1-40 | 0.1-30 | 0.1-30 |
| $2^{nd}$ RF/$1^{st}$ RF Power Ratio | 0.0:1-1:1 | 0.0:1-0.8:1 | 0.0:1-0.8:1 |
| Electrode Spacing (Millimeters) | 200-1000 | 200-500 | 200-500 |
| Total Film Thickness (Angstroms) | ≦1000 | ≦600 | ≦200 |
| Resistivity (ohm-meter) | $>1 \times 10^3$ | $>1 \times 10^4$ | $>1 \times 10^4$ |

Table 4 below summarizes exemplary electrical characteristics for a C-based switching layer formed within a PECVD chamber (e.g., as described above). C-based switching layers with other electrical characteristics may be formed.

TABLE 4

EXEMPLARY FILM PROPERTIES
PECVD Carbon material specification (43 nm)

| PARAMETER | SPECIFICATION |
|---|---|
| $V_{reset}$ | 2.13 V < $V_{reset}$ < 4.8 V |
| $I_{reset}$ | 10 µA < $I_{reset}$ < 32 µA |
| $V_{set}$ | 3 V < $V_{set}$ < 3.5 V |
| $I_{set}$ | 15.9 µA (post-set worst-case) |
| | 70.3 nA (pre-reset worst-case) |
| $I_{set}$ DC limit | 1 µA |
| $V_{form}$ | 2.13 V < $V_{form}$ < 4.8 V |
| $I_{form}$ | 10 µA < $I_{form}$ < 32 µA |
| $R_{off}$ | 55M to 10G |
| $R_{on}$ | 200k to 550k |
| $t_{form}$ | $T_r$ = 100-200 ns, $T_{reset}$ = 50-100 ns, $T_f$ = 50-100 ns |
| $t_{reset}$ | $T_r$ = 100-200 ns, $T_{reset}$ = 50-100 ns, $T_f$ = 50-100 ns |
| $t_{set}$ | 0.5 us to 2.5 us |
| $V_{read}$ | 1.5 < $V_{read}$ < 3.2 |

TABLE 4-continued

EXEMPLARY FILM PROPERTIES
PECVD Carbon material specification (43 nm)

| PARAMETER | SPECIFICATION |
|---|---|
| failure rate | 1000 (1e–4 drop-out rate) |
| Average | infant mortality 1 in 1000, cycle 2 to cycle |

Additional Embodiments for PECVD Formed Carbon-Switching Materials

In some embodiments of the invention, a memory cell may include a C-based switching film having a resistivity of at least $1\times10^5$ ohm/cm to be compatible with a steering element, such as a diode, used within the memory cell. As stated above, to achieve such a large resistivity, the C-based switching film may be produced with a high volume of $sp^3$ bonds, as $sp^3$ bonds are less conductive than $sp^2$ bonds. To be compatible with deposition or annealing processes performed during fabrication of a memory cell, the C-based switching film preferably is stable at temperatures above about 450° C. For example, the hydrogen content of the C-based switching film may be limited to about 15% or less to reduce changes in C-based film properties during subsequent heating cycles (e.g., above 450° C.).

To reduce the set and reset voltage for the C-based switching film, the C-based switching film may be relatively thin. For example, in some embodiments, the C-based switching film may have a thickness in the range from about 10 to 100 angstroms, preferably about 10 to 50 angstroms, although other thicknesses may be used. In one or more embodiments, such a C-based switching film may be formed as a film stack, such as from a first, higher density film followed by a lower density film. For example, the first C-based switching film may have a thickness of about 10 to 20 angstroms and a density of about 2.5 g/cm$^3$; whereas, the second C-based switching film may have a thickness of about 30 to 90 angstroms and a density of about 2 g/cm$^3$. More than two C-based switching films may be used, as may other film thicknesses and/or densities.

To reduce operation voltage and current, the volume of C-based switching material that is switched (the "switching volume") may be reduced. For example, in some embodiments, the C-based switching material initially may be in a highly resistive state (e.g., electrically "off" or "0" state). The first operation may be to switch the C-based switching film (e.g., to write a "1" into the C-based switching material). By controlling voltage and current, only about a filament of material may be caused to change from highly resistive to conductive. The next operation may be to write a "0" into the C-based switching film. The middle of the filament may have the maximum temperature and be the first to change to a less conductive $sp^3$ structure. Thus, only a small volume of material is switched and operation voltage and current may be reduced.

As stated above, temperature and/or ion bombardment may be controlled during PECVD to form a C-based switching material with high $sp^3$ content and limited hydrogen content. Table 5 below illustrates additional exemplary process parameters for forming such a film (e.g., a DLC film). It will be understood that the process parameters disclosed are merely exemplary and that other process parameters may be used. It should be understood that the carrier gas may comprise any suitable inert or non-reactive gas such as one or more of He, Ar, H$_2$, Kr, Xe, N$_2$, etc. In some embodiments, the hydrocarbon compound may have the formula C$_x$H$_y$, with x ranging from about 2 to 4 and y ranging from about 2 to 10.

TABLE 5

EXEMPLARY PECVD PROCESS PARAMETERS

| PROCESS PARAMETER | EXEMPLARY RANGE | PREFERRED RANGE |
|---|---|---|
| Carrier/Precursor Ratio | 0.1-15 | 0.3 |
| Chamber Pressure (Torr) | 0.1-10 | 5-9 |
| 1$^{st}$ RF frequency (MHz) | 10-50 | 13.5 |
| 2$^{nd}$ RF frequency (KHz) | 90-500 | 90 |
| 1$^{st}$ RF power density (Watts/cm$^2$) | 0.4-6 | 2-4 |
| 2$^{nd}$ RF/1$^{st}$ RF Power Ratio | 0-0.4 | 0 |
| Process Temperature (° C.) | 300-550 | 360-440 |
| Electrode Spacing (Mils) | 300-400 | 300 |

Amorphous $sp^3$-rich diamond-like carbon may be deposited by several other techniques such as filtered cathodic vacuum arc ("FCVA"), ion-assisted sputtering, ion beam deposition, pulsed laser ablation or the like. Each of these techniques employs highly energized carbon containing ionized species during carbon film formation. For FCVA film formation, for example, a two-step process may be used in which a high DC voltage is applied to the substrate during the first step so as to improve adhesion between the C-based switching layer and the substrate. During the second step, the DC voltage applied to the substrate may be reduced. The applied DC voltage adjusts ion energy during the two steps. Exemplary process parameters for forming a diamond-like carbon switching film using a graphite target are provided below in Table 6. Other process parameters may be used.

TABLE 6

EXEMPLARY FCVA PROCESS PARAMETERS

| PROCESS PARAMETER | EXEMPLARY RANGE | PREFERRED RANGE |
|---|---|---|
| Step 1 Chamber Pressure (milliTorr) | 1-100 | 50 |
| Step 1 DC voltage (Volts) | 200-2000 | 500 |
| Step 1 Arc Current (Amps) | 50-200 | 100 |
| Step 2 Chamber Pressure (milliTorr) | 1-100 | 50 |
| Step 2 DC voltage (Volts) | 10-200 | 50 |
| Step 2 Arc Current (Amps) | 50-200 | 100 |

In one exemplary embodiment, in the first step, chamber pressure may be set at about 0.1 milliTorr with argon or another inert gas, and the power supply adjusted to about 200-2000 volts DC. An arc is struck on a graphite target, such as with a mechanical striker, and arc current is set at about 100 amps. In the second step, DC voltage is lowered to about 10-200 volts while the other process parameters remain the same. The DC voltage changes the carbon ion energy reaching the substrate, while the low pressure helps produce highly directional, and highly energetic ion species. Arc current and DC voltage influence deposition rate.

Exemplary Device Formation

In some embodiments of the invention, thin C-based switching films may be integrated in series with a steering element such as a (vertical) diode or a thin film transistor ("TFT") to create a re-writable memory device. To achieve this, a C-based switching material may be formed between two metal layers or other conductors in a MIM planar stack. Such a MIM stack may be placed in series with a (vertical) diode or other steering element to create a re-writable memory device.

FIG. 1 is a cross-sectional view of an exemplary memory cell 100 formed in accordance with the present invention. With reference to FIG. 1, a first rail conductor 102 is formed above a substrate (not shown). For example, the first conductor 102 may include a tungsten layer or other conductive layer 104 with or without a titanium nitride ("TiN"), tantalum nitride ("TaN"), tungsten ("W"), tungsten nitride ("WN" molybdenum ("Mo"), or other adhesion/barrier layer 106. A vertical P—I—N or N—I—P diode 108, such as a deposited polysilicon or other polycrystalline semiconductor diode, is formed above first rail conductor 102. A TiN, TaN, W, WN, Mo, or other adhesion/barrier layer 110 is formed above the diode 108. The adhesion/barrier layer 110 may serve as a bottom electrode of a MIM stack 111.

In some embodiments, a silicide region (not shown) is formed in contact with the diode 108. As described in U.S. Pat. No. 7,176,064, "Memory Cell Comprising A Semiconductor Junction Diode Crystallized Adjacent To A Silicide," which is hereby incorporated by reference herein in its entirety for all purposes, silicide-forming materials such as titanium and cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., a silicide layer may enhance the crystalline structure of the diode 108 during annealing). Lower resistivity silicon thereby is provided. Similar results may be achieved for silicon-germanium alloy and/or germanium diodes.

In some embodiments, a metal hard mask (not shown) is formed above the diode 108. Use of metal hard masks is described, for example, in U.S. patent application Ser. No. 11/444,936, filed 13 May, 2006 and titled "Conductive Hard Mask To Protect Patterned Features During Trench Etch" (hereinafter "the '936 Application"), which is hereby incorporated by reference herein in its entirety for all purposes.

A C-based switching material 114 such as DLC, amorphous carbon containing microcrystalline graphene, carbon nanotubes ("CNTs"), other graphitic carbon, etc., is formed above the adhesion/barrier layer 110. In some embodiments, the C-based switching layer 114 may have a resistivity of at least $1\times10^4$ ohm-cm, preferably at least $1\times10^5$ ohm-cm and in some embodiments at least $1\times10^6$ ohm-cm. The C-based switching material 114 may be deposited and/or grown by any suitable technique such as CVD, High Density Plasma ("HDP") deposition, PECVD, FCVA, sputter deposition from an amorphous or graphite target, a spin on process, seeded growth, etc. In some embodiments, the C-based switching material 114 may be deposited using the process parameters described previously with reference to Tables 1-6. In at least some embodiments, post deposition treatment(s) may be employed such as annealing in reduced pressure or oxygen environments to affect or otherwise improve the properties of the C-based switching material 114. The C-based switching material 114 may serve as an insulating portion of MIM stack 111.

Thereafter, a top conductor 118 is formed above the upper C-based switching material 114. For example, the top conductor 118 may include a tungsten layer or other conductive layer 120 with or without a TiN, TaN, W, WN, Mo or other adhesion/barrier layer 122. A portion of the top conductor 118, such as the adhesion/barrier layer 122, may serve as a top electrode of the MIM stack 111. Note that in some embodiments, the diode 108 may be positioned above the C-based switching material 114.

The conductive layers 104, 120 may comprise, for example, about 200 to about 2500 angstroms of tungsten. Other conductive layer materials and/or thicknesses may be used. The adhesion layers 106, 110, 122 may comprise, for example, about 20 to about 500 angstroms, and preferably about 100 angstroms, of TiN or another suitable adhesion layer such as TaN, W, WN, Mo, combinations of one or more adhesion layers, or the like. Other adhesion layer materials and/or thicknesses may be employed. Exemplary widths for the conductors 102, 118 and/or spacings between the conductors range from about 200 to about 2500 angstroms, although other conductor widths and/or spacings may be used.

In one or more embodiments, the C-based switching material 114 may have a thickness of about 10 to 100 angstroms, preferably about 10 to 50 angstroms. Other thickness ranges may be used. In some embodiments, the C-based switching material 114 may be a film stack of two or more C-based switching layers as previously described (e.g., with different densities, with different adhesion characteristics, etc.).

Hydrocarbon precursor gas sources may include, but are not limited to, hexane, cyclo-hexane, acetylene, single and double short chain hydrocarbons such as methane, various benzene based hydrocarbons, polycyclic aromatics, aliphatic hydrocarbons, alicyclic hydrocarbons, aromatic hydrocarbons, short chain ester, ethers, and alcohols or a combination thereof.

In a preferred embodiment, the C-based switching material 114 is compatible with selection device current and voltage capability. As stated previously, there are primarily two different bond structures of interest in the above-described carbon films, namely $sp^2$ and $sp^3$. The $sp^3$ bond resembles a diamond-like structure which has a tetrahedral shape, whereas the $sp^2$ bond is more planar and takes a trigonal shape. For a C-based switching material, a desired ratio of $sp^2$ (double C═C bonds) to $sp^3$ (single C—C bonds) can be determined via, e.g., Raman spectroscopy by evaluating the D and G bands.

In general, deposition methods for the C-based switching layer 114 may include, but are not limited to, sputter deposition from a target, PECVD, CVD, arc discharge techniques, laser ablation, etc. In some embodiments, the deposition temperature used may be below approximately 500° C., and in some embodiments, below approximately 440-450° C. or even 400° C.

Figure 2:
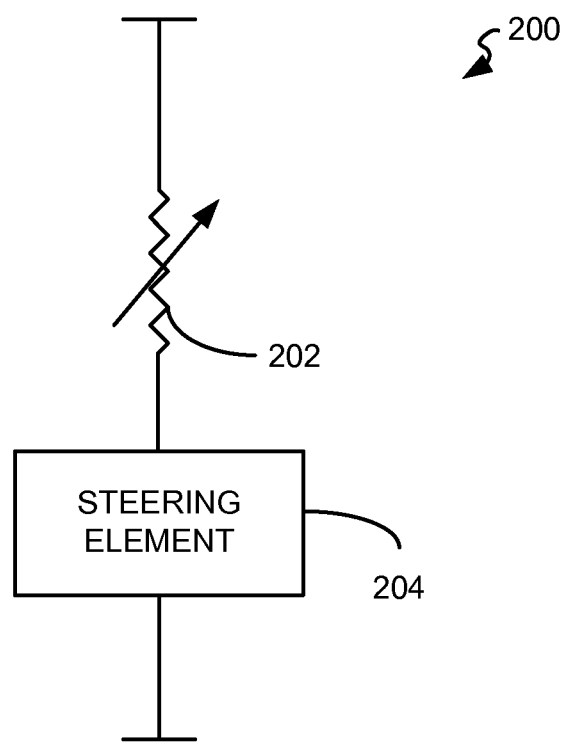
FIG. 2 is another exemplary memory cell in accordance with an embodiment of the present invention.

FIG. 2 is a schematic illustration of an exemplary memory cell 200 in accordance with the present invention. The memory cell 200 includes a C-based, reversible resistance-switching element 202 coupled to a steering element 204. For example, a C-based resistivity switching element 202, such as MIM stack 111 in FIG. 1, may be placed in series with a steering element 204, such as diode 108, to form memory cell 200. The steering element 204 may include a thin film transistor, a diode, or another suitable steering element that exhibits non-ohmic conduction by selectively limiting the voltage across and/or the current flow through the reversible resistance-switching element 202. In some embodiments, steering element 204 may be omitted, and memory cell 200 may be used with a remotely located steering element.

The reversible resistance-switching element 202 includes a reversible resistivity-switching material (not separately shown) having a resistivity that may be reversibly switched between two or more states. For example, the reversible resistivity-switching material of the element 202 may be in an initial, low-resistivity state upon fabrication that is switchable to a high-resistivity state upon application of a first voltage and/or current. Application of a second voltage and/or current may return the reversible resistivity-switching material to a low-resistivity state. Alternatively, the reversible resistance-switching element 202 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1," although more than two data/resistance states may be used. In some embodiments, the reversible resistivity-switching material may be a C-based switching film (as previously described).

Embodiments of the present invention prove particularly useful in formation of a monolithic three dimensional memory array. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Figure 3:
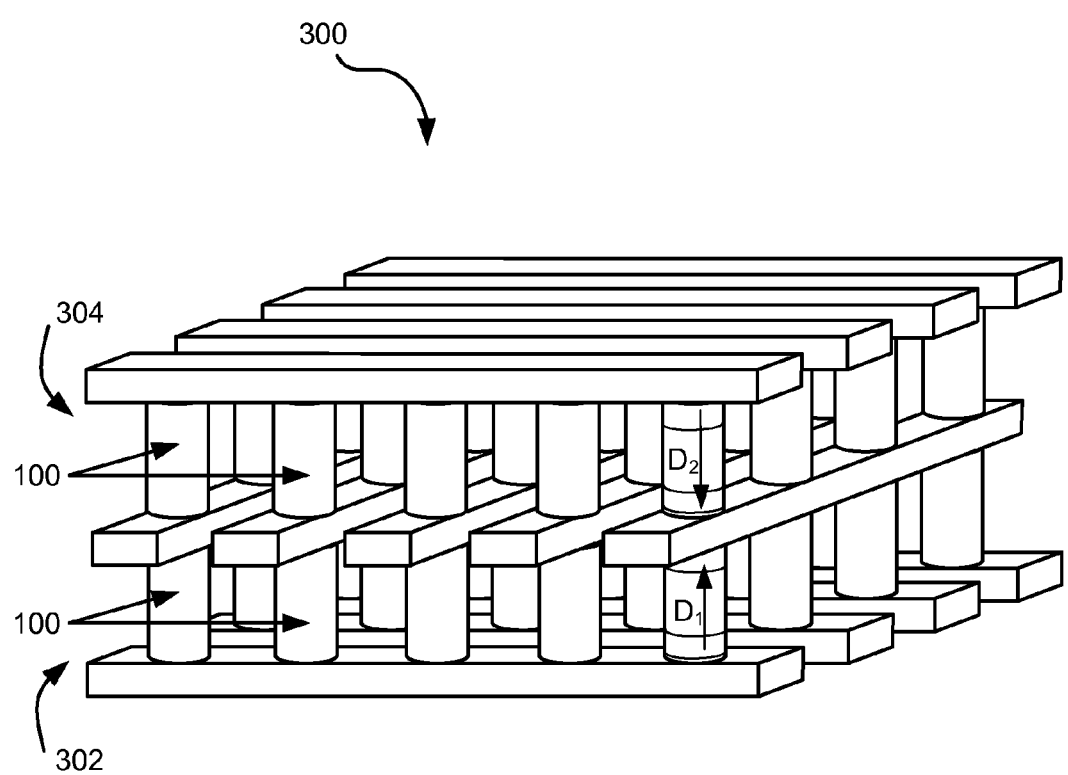
FIG. 3 is a perspective view of an exemplary memory level of a monolithic three dimensional memory array provided in accordance with the present invention.

For example, FIG. 3 is a simplified perspective view of a portion of a monolithic three dimensional array 300 that includes a first memory level 302 positioned below a second memory level 304. Memory levels 302 and 304 each include a plurality of memory cells 100 in a cross-point array. Other memory array configurations may be used, as may additional levels of memory. In some embodiments, the memory levels may be formed as described in U.S. Pat. No. 6,952,030, titled "High-Density Three-Dimensional Memory Cell," which is hereby incorporated by reference herein in its entirety for all purposes. For instance, the upper conductors of a first memory level may be used as the lower conductors of a second memory level that is positioned above the first memory level as shown in FIG. 3. In such embodiments, the diodes on adjacent memory levels preferably point in opposite directions as described in U.S. patent application Ser. No. 11/692,151, filed Mar. 27, 2007 and titled "Large Array Of Upward Pointing P—I—N Diodes Having Large And Uniform Current" (the "'151 Application"), which is hereby incorporated by reference herein in its entirety for all purposes. For example, as shown in FIG. 3, the diodes of the first memory level 302 may be upward pointing diodes as indicated by arrow D1 (e.g., with p regions at the bottom of the diodes), whereas the diodes of the second memory level 304 may be downward pointing diodes as indicated by arrow D2 (e.g., with n regions at the bottom of the diodes), or vice versa.

It will be understood that the above examples are non-limiting, and that the details provided herein can be modified, omitted, or augmented while the results fall within the scope of the invention.

The foregoing description discloses only exemplary embodiments of the invention. Modifications of the above disclosed apparatus and methods that fall within the scope of the invention will be readily apparent to those of ordinary skill in the art.

Accordingly, while the present invention has been disclosed in connection with exemplary embodiments thereof, it should be understood that other embodiments may fall within the spirit and scope of the invention, as defined by the following claims.

The invention claimed is:

1. A method of forming a memory cell, the method comprising:

forming a metal-insulator-metal ("MIM") stack above a substrate, the MIM stack including a carbon-based switching material having a resistivity of at least $1\times10^4$ ohm-cm; and forming a steering element coupled to the MIM stack, wherein forming the MIM stack comprises depositing a carbon-based switching material using plasma enhanced chemical vapor deposition ("PECVD") at a temperature of between 300° C. and 500° C.

2. The method of claim 1, wherein the carbon-based switching material has a resistivity of at least $1\times10^5$ ohm-cm.

3. The method of claim 1, wherein forming the MIM stack comprises depositing a carbon-based switching material using PECVD at a temperature of less than 440° C.

4. The method of claim 1, wherein forming the MIM stack comprises depositing a carbon-based switching material having an $sp^3$:$sp^2$ bond ratio of at least 0.3:0.7.

5. The method of claim 1, wherein forming the MIM stack comprises depositing a carbon-based switching material having an $sp^3$:$sp^2$ bond ratio of at least 1:1.

6. The method of claim 1, wherein forming the MIM stack comprises depositing a carbon-based switching material using filtered cathodic vacuum arc deposition.

7. The method of claim 1, wherein the steering element comprises a vertical polycrystalline diode.

8. The method of claim 1, further comprising:

forming a first conductive rail below the MIM stack and steering element; and forming a second conductive rail above the MIM stack and steering element.

9. The method of claim 1, wherein the carbon-based switching material comprises amorphous switchable carbon.

10. A method of forming a memory cell, the method comprising:

forming a first conducting layer above a substrate;

forming a steering element above the first conducting layer;

forming a carbon-based switching material above the first conducting layer, the carbon-based switching material having a resistivity of at least $1\times10^4$ ohm-cm; and forming a second conducting layer above the carbon-based switching material and the steering element, wherein forming the MIM stack comprises depositing a carbon-based switching material using plasma enhanced chemical vapor deposition ("PECVD") at a temperature of between 300° C. and 500° C.

11. The method of claim 10, wherein the carbon-based switching material has a resistivity of at least $1\times10^5$ ohm-cm.

12. The method of claim 10, wherein forming the carbon-based switching material comprises forming a metal-insulator-metal ("MIM") stack that includes the carbon-based switching material.

13. The method of claim 10, wherein forming the MIM stack comprises depositing a carbon-based switching material using PECVD at a temperature of less than about 440° C.

14. The method of claim 10, wherein forming the MIM stack comprises depositing a carbon-based switching material having an $sp^3$:$sp^2$ bond ratio of at least 0.3:0.7.

15. The method of claim 10, wherein forming the MIM stack comprises depositing a carbon-based switching material using filtered cathodic vacuum arc deposition.

16. The method of claim 10, wherein the steering element comprises a vertical polycrystalline diode.

17. The method of claim 10, wherein the carbon-based switching material comprises amorphous switchable carbon.

* * * * *